US012782446B2

(12) United States Patent
Jeong et al.

(10) Patent No.: US 12,782,446 B2
(45) Date of Patent: Nov. 3, 2026

(54) BATTERY STATE DETECTION DEVICE AND BATTERY PROTECTION DEVICE

(71) Applicant: LG ENERGY SOLUTION, LTD., Seoul (KR)

(72) Inventors: Suyeup Jeong, Daejeon (KR); Minkyu Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 574 days.

(21) Appl. No.: 18/016,233

(22) PCT Filed: Apr. 21, 2022

(86) PCT No.: PCT/KR2022/005726
§ 371 (c)(1),
(2) Date: Jan. 13, 2023

(87) PCT Pub. No.: WO2022/270736
PCT Pub. Date: Dec. 29, 2022

(65) Prior Publication Data

US 2023/0296679 A1 Sep. 21, 2023

(30) Foreign Application Priority Data

Jun. 25, 2021 (KR) ........................ 10-2021-0082830

(51) Int. Cl.
*H01M 10/00* (2006.01)
*G01R 31/364* (2019.01)
(Continued)

(52) U.S. Cl.
CPC ......... *G01R 31/382* (2019.01); *G01R 31/364* (2019.01); *H01M 10/48* (2013.01);
(Continued)

(58) Field of Classification Search
CPC ... G01R 31/382; G01R 31/364; H01M 10/48; H01M 50/583; H01M 2010/4271; H01M 2200/103
See application file for complete search history.

(56) References Cited

U.S. PATENT DOCUMENTS 5,343,192 A 8/1994 Yenisey
6,531,846 B1 * 3/2003 Smith ................. H02J 7/00309
320/135
(Continued)

FOREIGN PATENT DOCUMENTS

CN 201274274 Y 7/2009
EP 0 588 529 A2 3/1994
(Continued)

OTHER PUBLICATIONS

Japanese Office Action for Japanese Application No. 2023-503482, dated Dec. 4, 2023, with English translation.
(Continued)

*Primary Examiner* — Nicholas P D'Aniello
(74) *Attorney, Agent, or Firm* — Birch, Stewart, Kolasch & Birch, LLP

(57) ABSTRACT

An apparatus for detecting battery state may comprise a first fuse connected to a positive terminal of a battery; a second fuse connected to a negative terminal of the battery; a high resistance resistor connected to the first fuse and the second fuse and disposed in parallel with the battery; a sensor for measuring a current flowing through the high-resistance resistor or a voltage applied to the high-resistance resistor; and a controller for determining a system voltage and determine whether any of the fuses is blown based on the current measured or the voltage measured.

13 Claims, 6 Drawing Sheets

(51) Int. Cl.

| | |
|---|---|
| ***G01R 31/382*** | (2019.01) |
| ***H01M 10/48*** | (2006.01) |
| ***H01M 50/583*** | (2021.01) |
| *H01M 10/42* | (2006.01) |

(52) U.S. Cl.

CPC .. *H01M 50/583* (2021.01); *H01M 2010/4271* (2013.01); *H01M 2200/103* (2013.01)

(56) References Cited

U.S. PATENT DOCUMENTS

| | | | | |
|---|---|---|---|---|
| 2008/0185994 | A1* | 8/2008 | Altemose | H02J 7/0016 320/126 |
| 2010/0072950 | A1 | 3/2010 | Tatebayashi et al. | |
| 2013/0149572 | A1 | 6/2013 | Matsuo et al. | |
| 2014/0049263 | A1 | 2/2014 | Takala et al. | |
| 2018/0088180 | A1 | 3/2018 | Kamata | |
| 2018/0269698 | A1* | 9/2018 | Kondo | H02J 7/663 |
| 2019/0094311 | A1 | 3/2019 | Yamada | |
| 2019/0120878 | A1 | 4/2019 | Kim et al. | |
| 2019/0383690 | A1 | 12/2019 | Muraoka et al. | |
| 2021/0239767 | A1 | 8/2021 | Nam et al. | |
| 2022/0334189 | A1 | 10/2022 | Min | |
| 2022/0376520 | A1 | 11/2022 | Lee et al. | |
| 2024/0204267 | A1* | 6/2024 | Stewart | H01M 50/204 |

FOREIGN PATENT DOCUMENTS

| | | | |
|---|---|---|---|
| EP | 1 724 899 | B1 | 8/2016 |
| JP | 2010-19809 | A | 1/2010 |
| JP | 2010-230678 | A | 10/2010 |
| JP | 4836729 | B2 | 12/2011 |
| JP | 2012-157217 | A | 8/2012 |
| JP | 2014-238379 | A | 12/2014 |
| JP | 2017-215276 | A | 12/2017 |
| JP | 2018-21880 | A | 2/2018 |
| JP | 2018-54390 | A | 4/2018 |
| JP | 2018-125969 | A | 8/2018 |
| JP | WO2018/123673 | A1 | 10/2019 |
| KR | 10-1146694 | B1 | 5/2012 |
| KR | 10-1489219 | B1 | 2/2015 |
| KR | 10-2018-0037812 | A | 4/2018 |
| KR | 10-2020-0042238 | A | 4/2020 |
| KR | 10-2021-0007245 | A | 1/2021 |
| KR | 10-2021-0028356 | A | 3/2021 |
| KR | 10-2021-0071601 | A | 6/2021 |
| KR | 10-2263201 | B1 | 6/2021 |
| WO | WO2012/143819 | A1 | 10/2012 |

OTHER PUBLICATIONS

Japanese Office Action for Japanese Application No. 2023-503482, dated Apr. 22, 2024, with English translation.

International Search Report for PCT/KR2022/005726 mailed on Aug. 12, 2022.

European Communication pursuant to Article 94(3) EPC for European Application No. 22 828 585.4, dated Jun. 30, 2025.

European Communication pursuant to Article 94(3) EPC for European Application No. 22828585.4, dated Nov. 13, 2025.

* cited by examiner

[Figure 1]
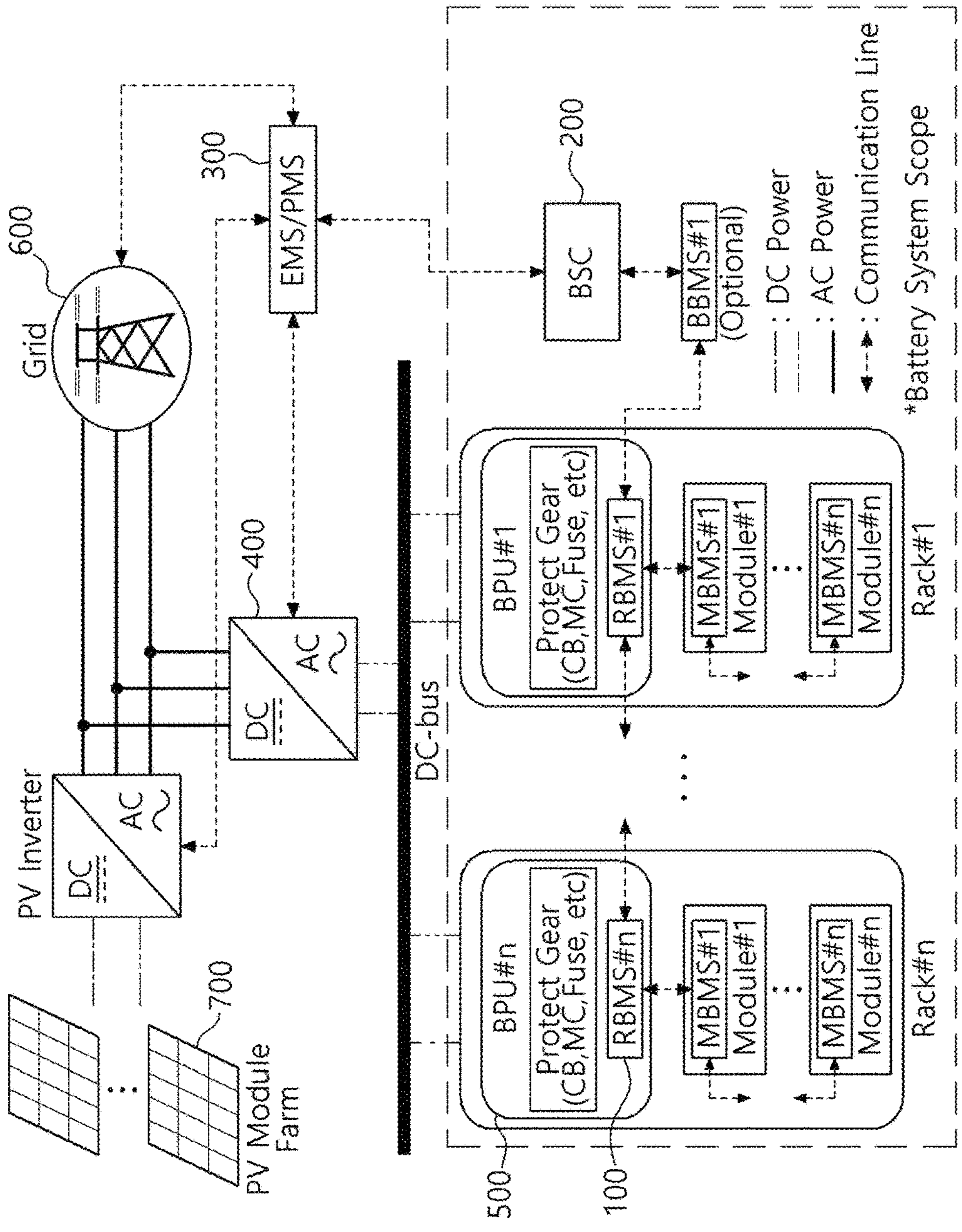

[Figure 2]
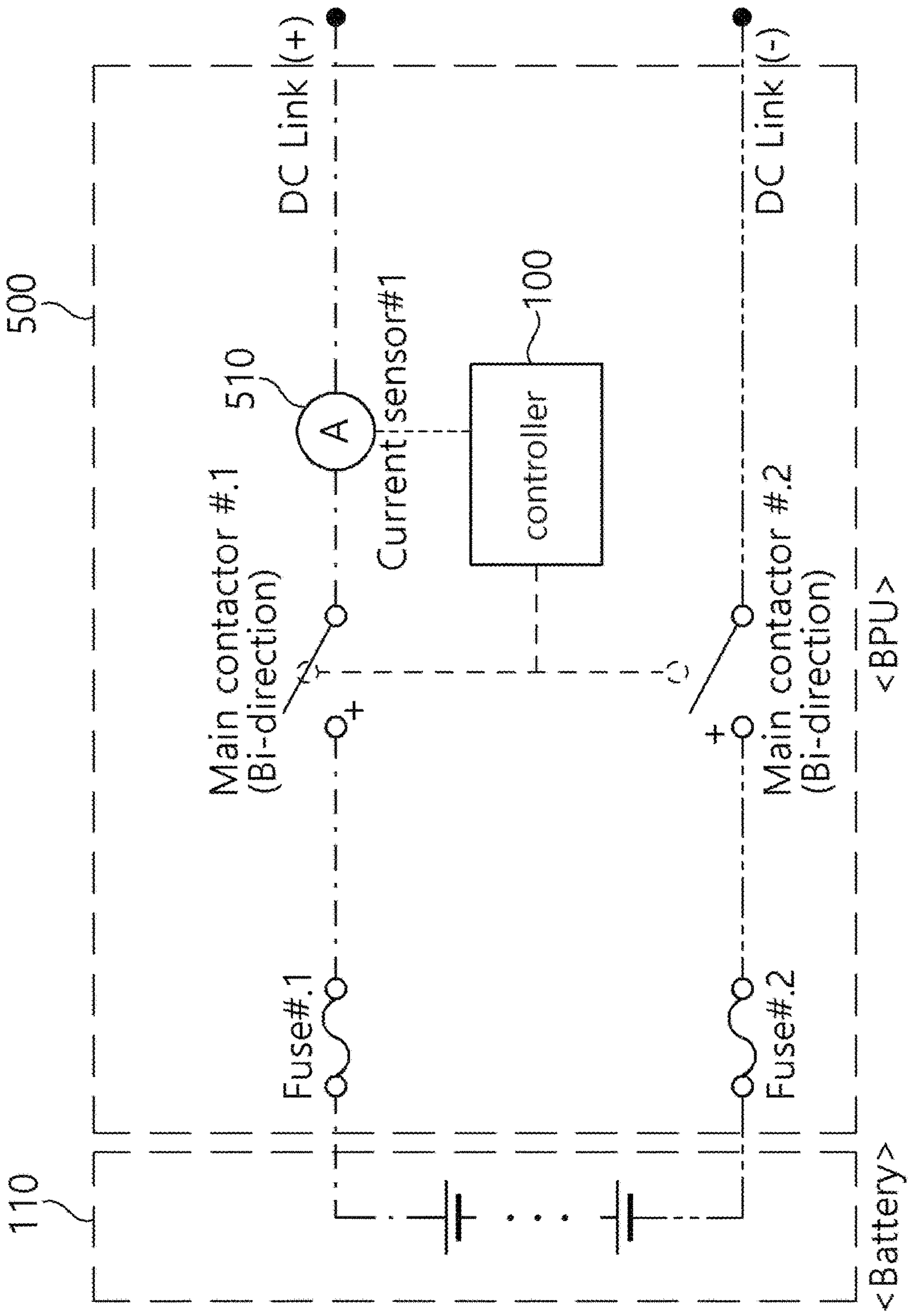

[Figure 3]
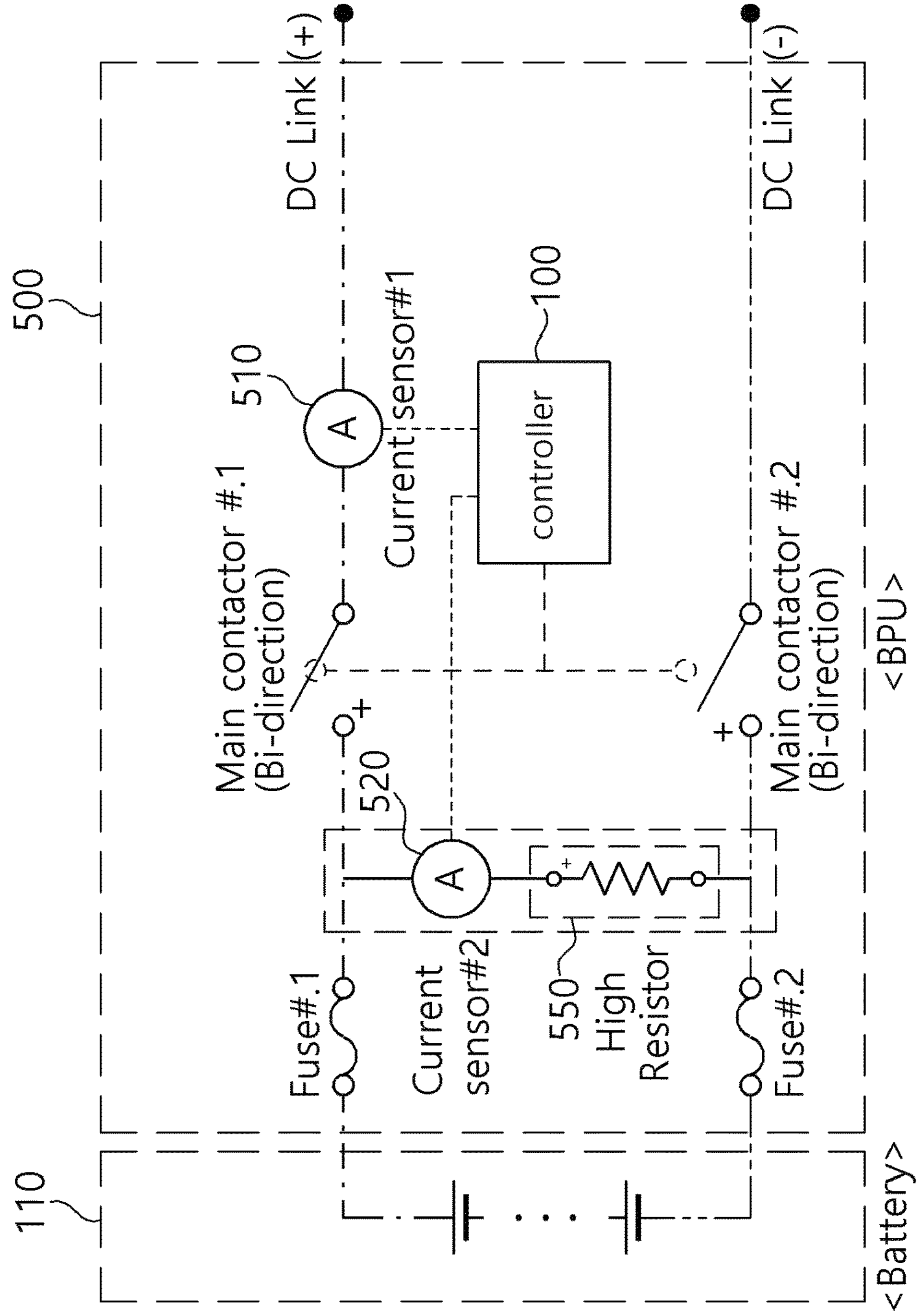

[Figure 4]
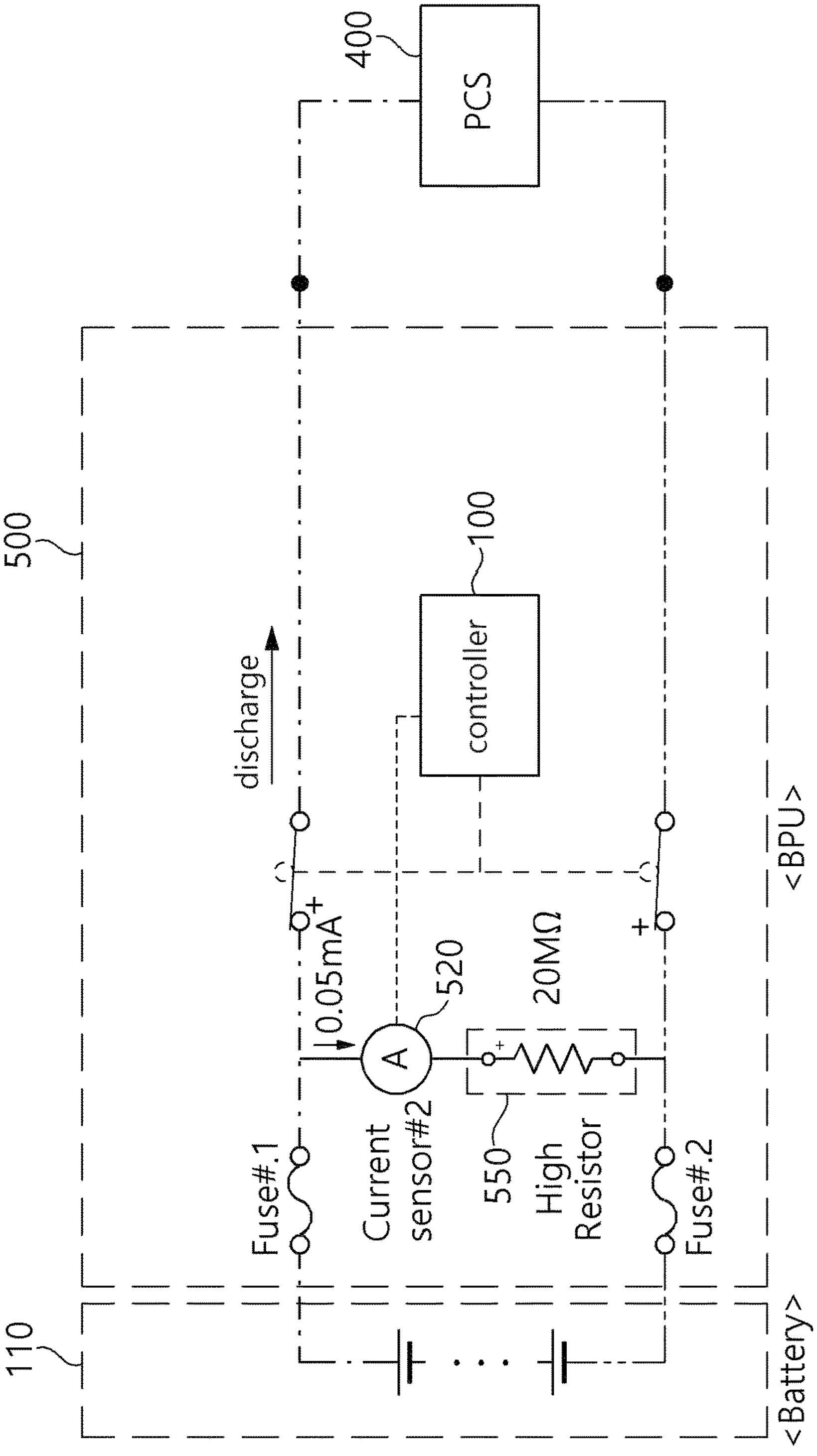

[Figure 5]
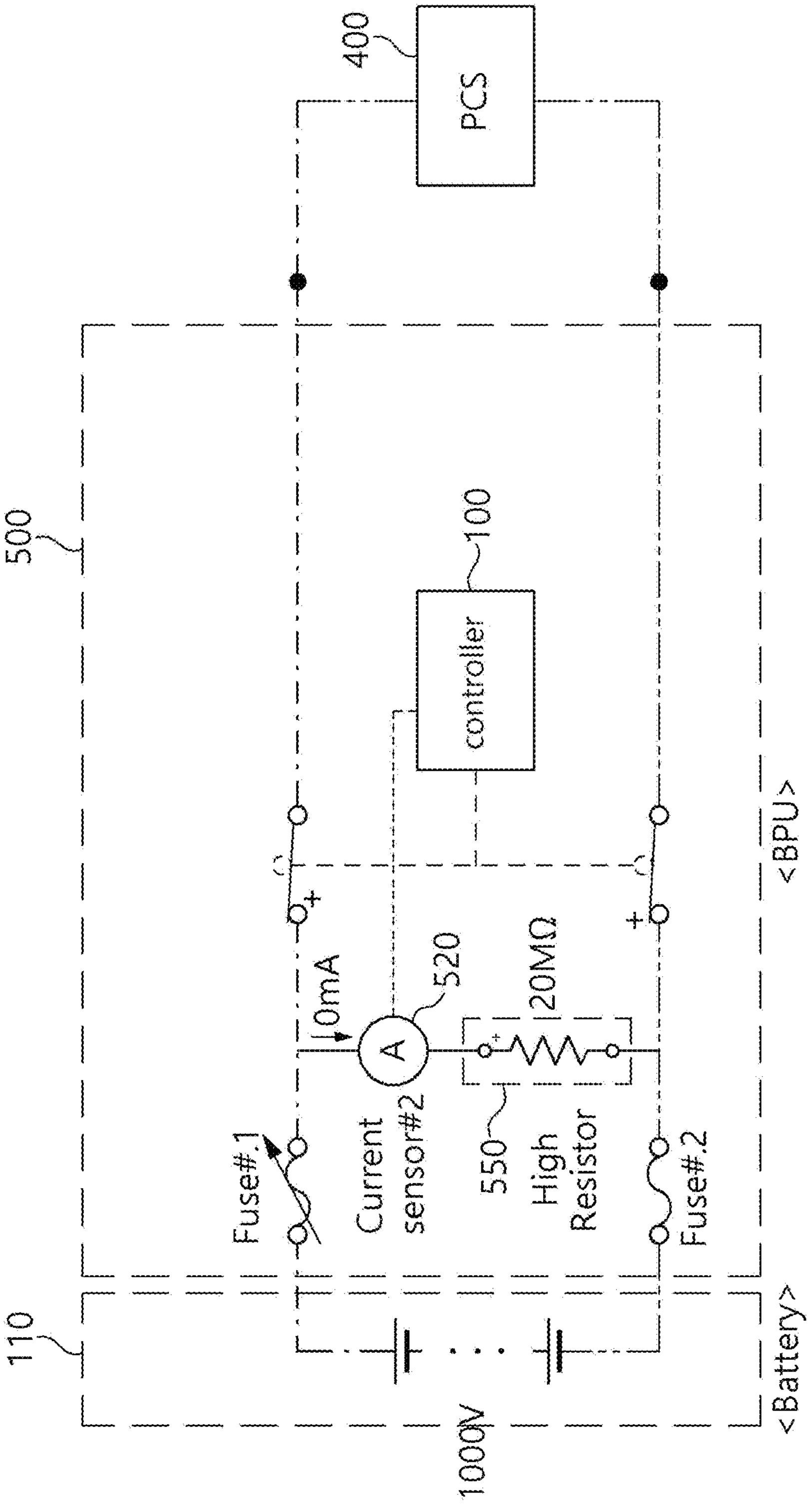

[Figure 6]
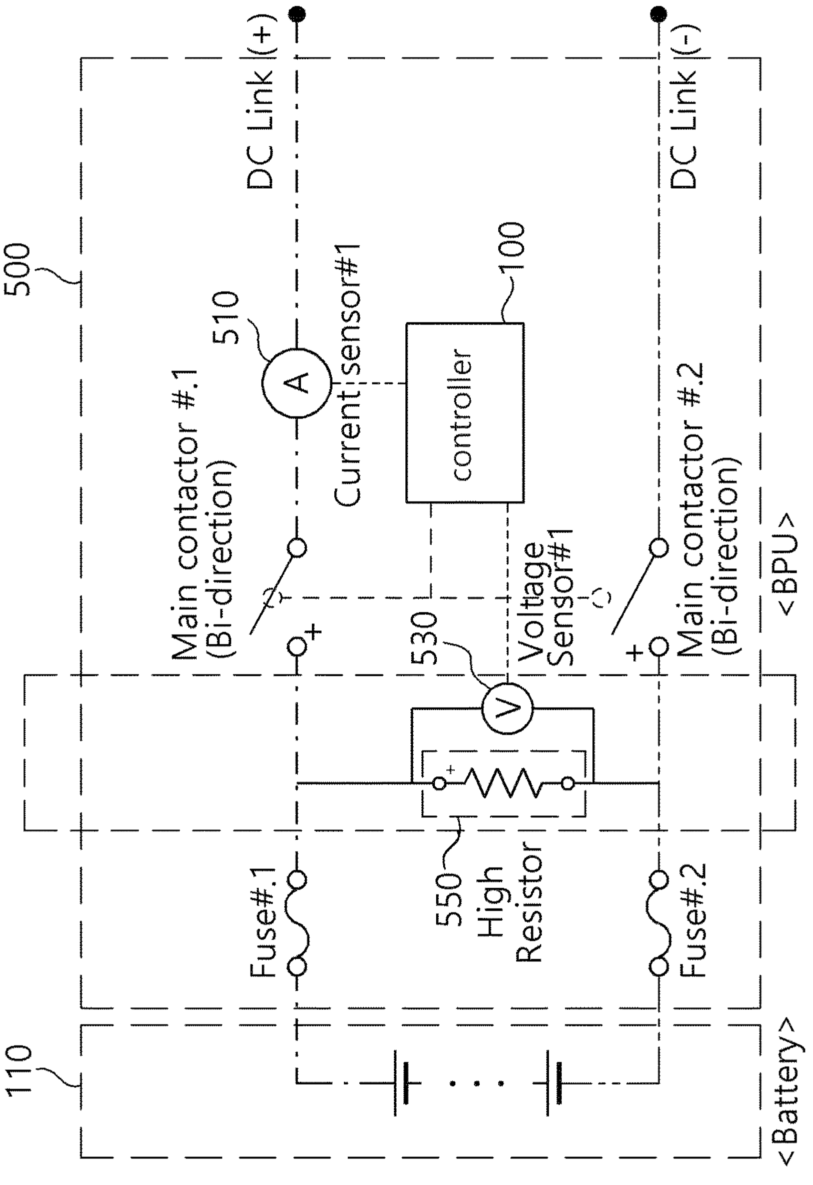

BATTERY STATE DETECTION DEVICE AND BATTERY PROTECTION DEVICE

TECHNICAL FIELD

This application claims priority to and the benefit of Korean Patent Application No. 10-2021-0082830 filed in the Korean Intellectual Property Office on Jun. 25, 2021, the entire contents of which are incorporated herein by reference.

The present invention relates to an apparatus for detecting battery state and a battery protection apparatus, and more particularly, to an apparatus for detecting battery state and a battery protection apparatus using a high-resistance parallel structure.

BACKGROUND ART

An energy storage system relates to renewable energy, a battery that stores electric power, and grid power. Recently, as the spread of smart grid and renewable energy is expanding and the efficiency and the stability of the power system are emphasized, a demand for energy storage systems for power supply and demand control and power quality improvement is increasing. Depending on a purpose of use, energy storage systems may have different output and capacity. In order to configure a large-capacity energy storage system, a plurality of battery systems may be connected.

In providing services related to an energy storage system, it is necessary to monitor and manage state of the battery. For this, the energy storage system usually provides information on a battery system voltage and existence of a blown battery fuse. For example, when a 17-stage battery rack is used as a battery, the voltages of 238 battery cells connected in series are respectively measured and summed to calculate the system voltage. Here, because the number of battery cells is large, an error generated by decimal point round-down calculation in a process of calculating individual voltages may be increased when the voltages for each battery cells are summed. In addition, it is not easy to determine whether a problem is caused from a fuse or from any another device when the battery is not charging or discharging.

As described, in the existing method of managing state of the battery, errors may occur in measuring the system voltage. Furthermore, it is not easy to detect immediately if a fuse in a battery system is blown.

SUMMARY

Technical Problem

Accordingly, example embodiments of the present disclosure are provided to substantially obviate one or more problems due to limitations and disadvantages of the related art.

Embodiments of the present disclosure provide an apparatus for detecting battery state, the apparatus being configured to determine a system voltage and determine whether a fuse is blown.

Embodiments of the present disclosure provide a battery protection apparatus including the apparatus for detecting battery state.

Technical Solution

In order to achieve the objective of the present disclosure, an apparatus for detecting battery state may comprise a first fuse connected to a positive terminal of a battery; a second fuse connected to a negative terminal of the battery; a high resistance resistor connected to the first fuse and the second fuse and disposed in parallel with the battery; a sensor configured to measure a current flowing through the high-resistance resistor or a voltage applied to the high-resistance resistor; and a controller configured to determine a system voltage and determine whether any of the first and second fuses is blown based on the current measured or the voltage measured.

In the embodiment, the sensor may be a current sensor positioned between the high resistance resistor and the first fuse and connected in series with the high resistance resistor or positioned between the high resistance resistor and the second fuse and connected in series with the high resistance resistor.

In addition, the sensor may be a voltage sensor connected in parallel with the high resistance resistor to measure the voltage applied to the high resistance resistor.

In the embodiment, the controller may be included in a battery management system (BMS) that manages a battery state.

The controller may also be configured to determine that at least one of the first fuse and the second fuse is blown when the current value measured by the current sensor is zero.

Furthermore, the controller may be configured to calculate a system voltage provided by the battery using the current value measured by the current sensor and the resistance value of the high resistance resistor.

The controller may be configured to determine that the fuse is blown when the voltage value measured by the voltage sensor is zero.

The controller may be configured to determine the voltage measured by the voltage sensor as a system voltage provided by the battery.

According to another embodiment of the present disclosure, a battery protection apparatus in an energy storage system including a battery and a power conversion system may comprise: a first fuse connected to a positive terminal of a battery; a second fuse connected to a negative terminal of the battery; a first main contactor configured to control a connection between the first fuse and the power conversion system; a second main contactor configured to control a connection between the second fuse and the power conversion system; a high resistance resistor connected to the first fuse and the second fuse and disposed in parallel with the battery; a sensor configured to measure a current flowing through the high-resistance resistor or a voltage applied to the high-resistance resistor; and a controller configured to determine a system voltage and determine whether any of the first and second fuses is blown from the measured current or measured voltage.

In the embodiment, the sensor may be a current sensor positioned between the high resistance resistor and the first fuse and connected in series with the high resistance resistor or positioned between the high resistance resistor and the second fuse and connected in series with the high resistance resistor.

The sensor may also be a voltage sensor connected in parallel with the high resistance resistor to measure a voltage applied to the high resistance resistor.

Advantageous Effects

According to the embodiment of the present disclosure with applying a high-resistance parallel structure, it is possible to provide a voltage information of the battery system and information on whether a fuse is blown, at low cost.

BRIEF DESCRIPTION OF THE DRAWINGS

Example embodiments of the present invention will become more apparent by describing in detail example embodiments of the present invention with reference to the accompanying drawings, in which:

FIG. 1 is a block diagram of an energy storage system to which the present invention may be applied.

FIG. 2 is a block diagram of a conventional battery state monitoring device.

FIG. 3 is a block diagram of an apparatus for detecting battery state according to an embodiment of the present invention.

FIG. 4 shows an example of determining system voltage information in an apparatus for detecting battery state according to an embodiment of the present invention.

FIG. 5 shows an example of checking whether a fuse is blown in the apparatus for detecting battery state according to an embodiment of the present invention.

FIG. 6 is a block diagram of an apparatus for detecting battery state according to another embodiment of the present invention.

DETAILED DESCRIPTION

Example embodiments of the present invention are disclosed herein. However, specific structural and functional details disclosed herein are merely representative for purposes of describing example embodiments of the present invention, and example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, exemplary embodiments of the present invention will be described in detail with reference to the accompanying drawings.

FIG. 1 is a block diagram of an energy storage system to which the present invention may be applied.

In an energy storage system (ESS), typically a battery cell is a minimum unit of storing energy or power. A series/parallel combination of battery cells may form a battery module, and a plurality of battery modules may form a battery rack. That is, a battery rack can be a minimum unit of a battery system as a series/parallel combination of battery modules. Here, depending on a device or a system in which the battery is used, a battery rack may be referred to as a battery pack.

Referring to FIG. 1, a battery rack may include a plurality of battery modules and a Battery Protection Unit (BPU) 500 or a protection device. The battery rack can be monitored and controlled through a rack battery management system (BMS) or RBMS 100. The RBMS 100 may monitor a current, a voltage and a temperature of each battery rack to be managed, calculate a State Of Charge (SOC) of the battery based on a monitoring result, and control charging and discharging.

The battery protection unit (BPU) 500 is a device for protecting the battery from an abnormal current and a fault current in a battery rack. The BPU may include a main contactor (MC), a fuse, a circuit breaker (CB) or a Disconnect Switch (DS), and the like. The BPU may control the battery system rack by rack through on/off controlling the main contactor based on a control from the Rack BMS. The BPU may also protect the battery from a short circuit current using a fuse in the event of a short circuit. As such, the battery system can be controlled through a protection device such as a BPU or a switchgear.

A battery section controller (BSC) 200 is located in each battery section which includes a plurality of batteries, peripheral circuits, and devices to monitor and control objects such as a voltage, a current, a temperature, and a circuit breaker. The battery section controller is an uppermost control device in a battery system including at least one of battery bank with a plurality of battery packs. The battery section controller may also be used as a control device in a battery system having a plurality of bank level structures.

A power conversion system (PCS) 400 installed in each battery section controls the power supplied from the outside and the power supplied from the battery section to the outside, thereby controlling charging and discharging of the battery. The power convertion system may include a DC/AC inverter. In case the energy storage system interworks with a photovoltaic system (PV), the system may include a PV inverter.

Meanwhile, the output of each BPU may be connected to the power conversion system 400 through a DC bus, and the power conversion system 400 may be connected to the power grid 600. In addition, an Energy Management System (EMS)/Power Management System (PMS) 300 may be configured to manage the energy storage system as a whole.

FIG. 2 is a block diagram of a conventional battery state monitoring device.

A device with a configuration as shown in FIG. 2 is conventionally used in order to monitor a battery state of an energy storage system.

Referring to FIG. 2, a first fuse is connected to the positive electrode of a series of batteries, and a second fuse is connected to the negative electrode of the battery. The other end of the first fuse is connected to the first main contactor, and the other end of the second fuse is connected to the second main contactor. Here, the first main contactor is connected to the positive terminal of the DC link and the second main contactor is connected to the negative terminal of the DC link.

In the conventional battery state monitoring structure, a current sensor 510 is arranged between the main contactor and the DC link, and a rack BMS estimates a sum of battery cell voltages based on the current value measured by the current sensor 510. In this structure, a case when a fuse is blown cannot be detected. It can be indirectly inferred that an error or problem has occurred in a fuse or any other components after recognizing that any current does not flow in response to a battery charge/discharge command. Thus, a normal maintenance manager cannot quickly and easily find out why charging and discharging does not work properly unless he/she is an experienced maintenance engineer.

The present invention is proposed to solve this problem, and through the embodiments shown in FIGS. 3 to 6, it is possible to simultaneously check the voltage information of the system and whether a fuse is blown.

FIG. 3 is a block diagram of an apparatus for detecting battery state according to an embodiment of the present invention.

Referring to FIG. 3, an apparatus for detecting battery state according to an embodiment of the present invention may comprise a first fuse connected to a positive terminal of a battery, a second fuse connected to a negative terminal of the battery, a high resistance resistor 550 connected to the first fuse and the second fuse and disposed in parallel with the battery, a sensor 520 configured to measure a current flowing through the high-resistance resistor, and a controller 100 configured to determine a system voltage and determine whether any of the fuses is blown from the measured current.

Here, the controller 100 may be a Rack BMS or may be included in the Rack BMS as a part of the Rack BMS.

In this embodiment, the sensor 520 may be a current sensor positioned between the high resistance resistor and the first fuse and may be connected in series with the high resistance resistor. In addition, the sensor may be a current sensor positioned between the high resistance resistor and the second fuse and may be connected in series with the high resistance resistor.

In the embodiment of the present invention shown in FIG. 3, a high resistance resistor 550 may be positioned between a contact point of the first fuse and the first main contactor and a contact point of the second fuse and the second main contactor and may be arranged in parallel with the battery 110.

A fuse is one of the main components of a battery protection device. It is a protection device that can be passively disconnected to protect the battery when a short-circuit current occurs and is a one-time component that is essential for periodic replacement during use. A main contactor is an electrical switchgear, generally called as a magnetic contactor. The DC link must be closed to the ESS main circuits to enable charging and discharging of the battery.

Here, the resistance value of the high resistance resistor may be several megaohms (MΩ). In the present invention, the high-resistance resistor is connected in parallel with the battery so that a small current of several mA flows through the high-resistance resistor and the small current is measured through the current sensor 520 connected in series with the high-resistance resistor. The controller may analyze the measured small current value and get information on a system voltage and information on whether fuse 1 or fuse 2 is blown. Accordingly, the current sensor 510 that used to be arranged in a conventional device may not necessarily be used.

The apparatus for detecting battery state according to the present invention may use the element 550 having high resistance and let only a small current flow through the element, thereby monitoring the battery state without significantly affecting system-specific functions of battery charging and discharging.

Furthermore, referring to FIG. 3, a battery protection apparatus 500 according to an embodiment of the present invention includes: a first fuse connected to a positive terminal of a battery; a second fuse connected to a negative terminal of the battery; a first main contactor configured to control a connection between the first fuse and the power conversion system; a second main contactor configured to control a connection between the second fuse and the power conversion system; a high resistance resistor 550 connected to the first fuse and the second fuse and disposed in parallel with the battery; a sensor 520 configured to measure a current flowing through the high-resistance resistor or a voltage applied to the high-resistance resistor; and a controller 100 configured to determine a system voltage and determine whether any of the fuses is blown from the measured current or measured voltage.

FIG. 4 shows an example of determining system voltage information in an apparatus for detecting battery state according to an embodiment of the present invention.

In the example shown in FIG. 4, a method for calculating a system voltage value using a current flowing through the high resistance resistor without knowing the system voltage provided by the battery. For example, in case that a resistance value of the high resistance resistor used in FIG. 4 is 20 megaohms (MΩ) and a measured current flowing through the high resistance resistor is 0.05 mA, the system voltage can be calculated as 0.05 m*20 M=1000 (V) using the V=IR formula.

As described, a high-resistance resistor is connected in parallel with the battery so that a small current of several mA flows through the high-resistance resistor, and the small current is measured through a current sensor 520 connected in series with the high-resistance resistor. The measured small current value can be analyzed by a controller 100 to determine the battery system voltage and whether a fuse therein is blown.

FIG. 5 shows an example of checking whether a fuse is blown in the apparatus for detecting battery state according to an embodiment of the present invention.

FIG. 5 shows an example case in which any current cannot be detected by a current sensor, that is, a current value with zero or close to zero is measured. In this case, the controller 100 may determine, from the current value measured by the current sensor, that one of the fuses (Fuse 1 or Fuse 2) is blown.

FIG. 6 is a block diagram of an apparatus for detecting battery state according to another embodiment of the present invention.

In another embodiment of the present invention shown in FIG. 6, a high resistance resistor 550 is provided between a contact point of the first fuse and the first main contactor and a contact point between the second fuse and the second main contactor, and is connected in parallel with the battery 110. Here, the resistance value of the high resistance resistor may be several megaohms (MΩ).

That is, the apparatus for detecting battery state according to the present invention may comprise: a first fuse connected to a positive terminal of a battery; a second fuse connected to a negative terminal of the battery; a high resistance resistor 550 connected to the first fuse and the second fuse and disposed in parallel with the battery; a sensor 530 configured to measure a voltage applied to the high-resistance resistor; and a controller 100 configured to determine a system voltage and determine whether any of the fuses is blown from the measured voltage. In the embodiment, the sensor may be a voltage sensor connected in parallel with the high resistance resistor to measure a voltage applied to the high resistance resistor.

In the embodiment of FIG. 6, a voltage applied to the high resistance resistor may be measured by a voltage sensor 530 connected in parallel with the high resistance resistor.

The voltage value applied to the high resistance resistor measured by the voltage sensor 530, when the fuses operate normally, may be the same as or similar to the system voltage value which is a sum of the voltage values of a plurality of batteries connected in series. In case a fuse is blown, the voltage applied to the high resistance resistor would be close to zero.

That is, when a voltage value measured by the voltage sensor is a normal voltage value that can be expected from the battery system (for example, in a case of a 17 module-stage rack in which a battery cell voltage is 4.2V, the voltage output by the battery rack can be 999.6V since a module has a voltage value of 58.8V when SOC is 100%.), the controller 100 may determine the measured voltage as the system voltage. On the other hand, the controller 100 may determine that a fuse is blown when the voltage measured by the voltage sensor is close to zero.

As described above, it is possible to economically implement the functions of checking a battery system voltage and checking state of a battery fuse through the high-resistance parallel structure provided by the embodiments of the present invention.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the example embodiments of the present invention and their advantages have been described in detail, it should be understood that various changes, substitutions and alterations may be made herein without departing from the scope of the invention.

The invention claimed is:

1. An apparatus for detecting a battery state, the apparatus comprising:
- a first fuse connected to a positive terminal of a battery;
- a second fuse connected to a negative terminal of the battery;
- a high resistance resistor connected to the first fuse and the second fuse and disposed in parallel with the battery;
- a sensor configured to measure a current flowing through the high resistance resistor or a voltage applied to the high resistance resistor; and
- a controller configured to determine a system voltage and determine whether any of the first and second fuses is blown based on the current measured or the voltage measured,
- wherein the sensor is connected in series with the high resistance resistor and is connected in parallel with the battery,
- wherein the sensor is located between the high resistance resistor and one of the first fuse or the second fuse, and
- wherein the sensor is a current sensor positioned between the high resistance resistor and the first fuse.

2. The apparatus for detecting the battery state of claim 1, wherein the controller is included in a battery management system (BMS) that manages a battery state.

3. The apparatus for detecting the battery state of claim 1, wherein the controller is configured to determine that at least one of the first fuse and the second fuse is blown when a current value measured by the current sensor is zero.

4. The apparatus for detecting the battery state of claim 1, wherein the controller is configured to calculate the system voltage provided by the battery using a current value measured by the current sensor and a resistance value of the high resistance resistor.

5. A battery protection apparatus in an energy storage system including a battery and a power conversion system, the battery protection apparatus comprising:
- a first fuse connected to a positive terminal of the battery;
- a second fuse connected to a negative terminal of the battery;
- a first main contactor configured to control a connection between the first fuse and the power conversion system;
- a second main contactor configured to control a connection between the second fuse and the power conversion system;

a high resistance resistor connected to the first fuse and the second fuse and disposed in parallel with the battery;

a sensor configured to measure a current flowing through the high resistance resistor or a voltage applied to the high resistance resistor; and a controller configured to determine a system voltage and determine whether any of the first and second fuses is blown from the measured current or measured voltage, wherein the sensor is connected in series with the high resistance resistor and is connected in parallel with the battery, wherein the sensor is located between the high resistance resistor and one of the first fuse or the second fuse, and wherein the sensor is a current sensor is connected in series with the high resistance resistor.

6. The battery protection apparatus of claim 5, wherein a first end of the sensor is connected to an end of the first fuse and an end of the first main contactor through a first wire, and wherein the second end of the sensor is connected to an end of the high resistance resistor through a second wire.

7. The battery protection apparatus of claim 5, wherein the controller is directly connected to the sensor.

8. The battery protection apparatus of claim 5, wherein the sensor is located between the first fuse and the first main contactor.

9. The apparatus for detecting the battery state of claim 1, further comprising:

a first main contactor configured to control a connection to the first fuse and a positive terminal of a direct current (DC) link; and a second main contactor configured to control a connection to the second fuse and a negative terminal of the DC link.

10. The apparatus for detecting the battery state of claim 9, wherein the high resistance resistor is connected between the second main contactor and the second fuse.

11. The apparatus for detecting the battery state of claim 9, further comprising a current sensor located between the first main contactor and the positive terminal of the DC link.

12. The battery protection apparatus of claim 5, wherein the sensor and the high resistance resistor are located on a line having a first end connected to a positive terminal of a Direct Current (DC) link and a second end connected to a negative terminal of the DC link.

13. The battery protection apparatus of claim 5, further comprising a controller connected to the sensor, the first main contactor and the second main contactor, the controller being configured to control the sensor, the first main contactor and the second main contactor.

* * * * *